(12) United States Patent
Gaudl et al.

(10) Patent No.: US 10,995,193 B2
(45) Date of Patent: May 4, 2021

(54) LIQUID MODIFIED PET POLYESTERS FOR LITHOGRAPHIC INKS

(71) Applicant: SUN CHEMICAL CORPORATION, Parsippany, NJ (US)

(72) Inventors: Kai-Uwe Gaudl, Bavaria (DE); Ralf Schuermann, Hessen (DE); Freddy Delahaye, Canly (FR); Annabelle Petit, Compiegne (FR)

(73) Assignee: SUN CHEMICAL CORPORATION, Parsippany, NJ (US)

( * ) Notice: Subject to any disclaimer, the term of this patent is extended or adjusted under 35 U.S.C. 154(b) by 52 days.

(21) Appl. No.: 16/302,774

(22) PCT Filed: May 22, 2017

(86) PCT No.: PCT/US2017/033805
§ 371 (c)(1),
(2) Date: Nov. 19, 2018

(87) PCT Pub. No.: WO2017/205275
PCT Pub. Date: Nov. 30, 2017

(65) Prior Publication Data
US 2019/0127549 A1    May 2, 2019

Related U.S. Application Data

(60) Provisional application No. 62/340,017, filed on May 23, 2016.

(51) Int. Cl.
| | |
|---|---|
| *C08J 11/24* | (2006.01) |
| *C09D 11/104* | (2014.01) |
| *C09D 167/08* | (2006.01) |
| *G03F 7/00* | (2006.01) |

(52) U.S. Cl.
CPC ............. *C08J 11/24* (2013.01); *C09D 11/104* (2013.01); *C09D 167/08* (2013.01); *G03F 7/0002* (2013.01); *C08J 2367/02* (2013.01); *C08J 2367/08* (2013.01)

(58) Field of Classification Search
CPC .... C08J 11/24; C08J 2367/02; C08J 2367/08; C09D 11/104; C09D 167/08; G03F 7/0002
See application file for complete search history.

(56) References Cited

U.S. PATENT DOCUMENTS

| | | | |
|---|---|---|---|
| 6,127,436 A | 10/2000 | Chatterjee et al. | |
| 2012/0245246 A1 | 9/2012 | Yin et al. | |
| 2015/0344622 A1 | 12/2015 | Mukerjee et al. | |
| 2016/0229981 A1* | 8/2016 | Phillips ................ | C08G 63/916 |

FOREIGN PATENT DOCUMENTS

| | | |
|---|---|---|
| JP | 2005-060514 | 3/2005 |
| JP | 2005-200563 | 7/2005 |
| JP | 2005-213401 | 8/2005 |
| JP | 2005-213402 | 8/2005 |
| RU | 2 209 818 C1 | 8/2003 |
| RU | 2 285 705 C1 | 10/2006 |
| WO | WO 99/20684 A1 | 4/1999 |
| WO | WO 2015/164331 A1 | 10/2015 |
| WO | WO 2016/028492 A1 | 2/2016 |

OTHER PUBLICATIONS

PCT International Search Report issued in PCT/US2017/33805 dated Aug. 22, 2017.
Written Opinion of the International Searching Authority issued in PCT/US2017/33805 dated Aug. 22, 2017.
International Preliminary Report issued in PCT/US2017/033805, dated Nov. 27, 2018.
Supplementary European Search Report issued in counterpart EP 17 80 3361, dated Feb. 3, 2020.
Database WPI Week 197927, Thomson Scientific, London, GB; AN 1979-50309B XP002797102, & SU 622 824 A (Kharkov Poly) Jul. 26, 1978 * abstract *.

* cited by examiner

*Primary Examiner* — Frances Tischler
(74) *Attorney, Agent, or Firm* — Marian Fundytus; Ostrolenk Faber LLP.

(57) ABSTRACT

The present invention is directed to a method of making liquid polyester resins, and the liquid polyester resins produced by the method. The liquid polyester resins are prepared by depolymerizing virgin, scrap, recycled or reclaimed polyethylene terephthalate (PET) via an alcoholysis reaction with one or more mono-alcohols and/or polyols; transesterifying the resulting polyol oligomer with vegetable oils or fatty acid alkyl esters; and re-polymerizing with acids or anhydrides. The present invention also provides ink and coating compositions, and overprint varnishes, comprising the liquid polyester resins of the invention.

6 Claims, No Drawings

US 10,995,193 B2

LIQUID MODIFIED PET POLYESTERS FOR LITHOGRAPHIC INKS

CROSS-REFERENCE TO RELATED APPLICATIONS

The present application is a § 371 National Stage application based on PCT/US2017/033805 filed May 22, 2017, which claims the benefit of U.S. Provisional Application No. 62/340,017, filed May 23, 2016, the subject matter of each of which is incorporated by reference in their entirety.

FIELD OF THE INVENTION

The present invention is related to liquid polyester resins prepared from virgin, scrap, recycled, and/or reclaimed polyethylene terephthalate (PET). The liquid polyester resins are suitable as raw materials for preparation of ink and coating compositions, such as lithographic ink and coating compositions.

BACKGROUND OF THE INVENTION

Recycling of polyethylene terephthalate (PET), whether post-consumer or pre-consumer, is a worldwide concern due to its environmental impact and large increasing volumes of these materials produced by society. For example, as a solution, chemical recycling, such as de-polymerization by glycolysis of PET, yields well defined re-usable resins with hydroxyl groups. Polyester polyols coming from the glycolysis of PET waste have been well known to be utilized as starting material in the manufacture of polyurethane foams and adhesives, unsaturated polyesters, and saturated polyester plasticizers.

U.S. Pat. No. 6,127,436 teaches a method of depolymerizing reclaimed, recycled or virgin PET via an alcoholysis reaction using glycols and polyhydric alcohols, followed by an esterification with polybasic carboxylic acids and/or anhydrides, to produce a hard inert resin. However, these resins have only limited solubility in higher polar solvents, and are insoluble in mineral oils, vegetable oils and fatty acid alkyl esters, and toluene. The resins disclosed also are not compatible with rosin resin and hydrocarbon resin.

JP 2005-213401, JP-2005-213402, JP-2005-200563, and JP 2005-060514 disclose hard rosin resins and hydrocarbon resins which contain recycled PET that are more soluble in less polar solvents. However, the amount of PET that can be included in these resins is limited.

Thus, there remains a need for liquid resins made from recycled PET, that can be used as a replacement for alkyd resins and ink varnishes. In addition, these liquid PET resins should be compatible with mineral oils, vegetable oils, fatty acid alkyl esters, alkyd resins, hydrocarbon resins, and rosin resins. It would be preferable for these liquid resins to have a high content of recycled PET.

BRIEF SUMMARY OF THE INVENTION

The present invention provides novel liquid polyester resins produced by a 3 step process: (A) depolymerizing virgin, scrap, recycled or reclaimed polyethylene terephthalate (PET) via an alcoholysis reaction with one or more mono-alcohols and/or polyols; (B) transesterifying the resulting polyol oligomer with vegetable oils or fatty acid alkyl esters; and (C) re-polymerizing with acid and/or anhydrides. The liquid polyester resins of the present invention are the first resins made from recycled PET that are of a quality sufficient to replace the typical resins in ink and coating compositions, and achieve comparable print results as inks an coatings containing only single use raw materials.

In a particular aspect, the present invention provides a method of making a liquid polyester resin comprising the steps of:
a) depolymerizing virgin, scrap, recycled or reclaimed polyethylene terephthalate (PET) via an alcoholysis reaction with one or more mono-alcohols and/or polyols;
b) transesterifying the resulting polyol oligomer of step a) with one or more vegetable oils, fatty acid alkyl esters, or oil-modified alkyd resins; and
c) re-polymerizing the oil-modified polyol oligomer of step b) via reaction with one or more acids or anhydrides.

In another aspect, the present invention provides ink and coating compositions comprising the novel liquid polyester resins.

In another aspect, the present invention provides overprint varnishes comprising the novel liquid polyester resins.

In yet another aspect, the present invention provides printed articles comprising the ink and coating compositions, and/or overprint varnishes.

Other advantages and aspects of the invention will become apparent from the detailed description below.

DETAILED DESCRIPTION OF THE INVENTION

It is to be understood that the foregoing general description and the following detailed description are exemplary and explanatory only, and are not restrictive of any subject matter claimed.

Unless otherwise defined, all technical and scientific terms used herein have the same meaning as is commonly understood by one of skill in the art to which the inventions belong. All patents, patent applications, published applications and publications, websites and other published materials referred to throughout the entire disclosure herein, unless noted otherwise, are incorporated by reference in their entirety for any purpose.

The present invention provides novel liquid polyester resins prepared from virgin, scrap, recycled and/or reclaimed PET. The liquid polyester resins of the invention are compatible with mineral oils, vegetable oils, fatty acid alkyl esters, alkyd resins, hydrocarbon resins, and rosin resins. The liquid polyester resins of the present invention can have a high content of recycled PET. In addition, the liquid polyester resins of the present invention are suitable for use as a raw material in ink and coating compositions. Advantageously, the liquid polyester resins of the invention are suitable for use in lithographic ink and coating compositions.

Definitions

In this application, the use of the singular includes the plural unless specifically stated otherwise. As used herein, the singular forms "a," "an" and "the" are intended to include the plural forms as well, unless the context clearly indicates otherwise.

In this application, the use of "or" means "and/or" unless stated otherwise.

As used herein, the terms "comprises" and/or "comprising" specify the presence of the stated features, integers, steps, operations, elements, and/or components, but do not preclude the presence or addition of one or more other features, integers, steps, operations, elements, components, and/or groups thereof. Furthermore, to the extent that the terms "includes," "having," "has," "with," "composed," "comprised" or variants thereof are used in either the detailed description or the claims, such terms are intended to be inclusive in a manner similar to the term "comprising."

As used herein, ranges and amounts can be expressed as "about" a particular value or range. "About" is intended to also include the exact amount. Hence "about 5 percent" means "about 5 percent" and also "5 percent." "About" means within typical experimental error for the application or purpose intended.

As used herein, the terms "inks and coatings," "inks," "compositions" and "fluids" are used interchangeably. Unless specified otherwise, the terms "inks and coatings," "inks," "compositions" and "fluids" include overprint varnishes.

As used herein, the terms "monohydric alcohol" or "mono-alcohol" mean a hydrocarbon, such as an alkyl, alkylene, cycloalkyl, or aryl, having one functional OH group.

As used herein, the terms "polyhydric alcohol" or "polyol" mean a hydrocarbon, such as an alkyl, alkylene, cycloalkyl, or aryl, having two or more functional OH groups.

As used herein, the term "article" or "articles" means a substrate or product of manufacture. Examples of articles include, but are not limited to: substrates such as paper, plastic, plastic or polymer film, glass, ceramic, metal, composites, and the like; and products of manufacture such as publications (e.g. brochures), labels, and packaging materials (e.g. cardboard sheet or corrugated board), containers (e.g. bottles, cans), a polyolefin (e.g. polyethylene or polypropylene), a polyester (e.g. polyethylene terephthalate), a metalized foil (e.g. laminated aluminum foil), metalized polyester, a metal container, and the like.

Throughout this disclosure, all parts and percentages are by weight (wt % or mass % based on the total weight) and all temperatures are in ° C. unless otherwise indicated.

Synthesis of Vegetable Oil-Modified PET Polyester

The present invention provides a polyester synthesized from PET, preferably recycled PET, but also reclaimed waste material generated in PET production (pre-consumer PET), as well as various waste PET molded articles, and regrinds of waste PET generated in production of PET molded articles can be used. Moreover, post-consumer PET waste flakes, PET grind and powder, obtained by physically and mechanically grinding PET bottles into chips, powder, pellets, or flakes, is suitable for use in the liquid polyester resins of the present invention. Additionally, PET recycled from PET yarns, PET clothing, PET protective films, and PET packaging material can be used as well.

In a particular aspect, the present invention provides a method of making a liquid polyester resin comprising the steps of:
  a) depolymerizing virgin, scrap, recycled or reclaimed polyethylene terephthalate (PET) via an alcoholysis reaction with one or more mono-alcohols and/or polyols;
  b) transesterifying the resulting polyol oligomer of step a) with one or more vegetable oils, fatty acid alkyl esters, or oil-modified alkyd resins; and
  c) re-polymerizing the oil-modified polyol oligomer of step b) via reaction with one or more acids or anhydrides.

It is an advantage of the present invention that even mixed, highly colored PET can be tolerated, as the color for the final resin is usually dominated by the usual light to dark brown color of the vegetable oils which are used in the synthesis of the liquid polyester resins, as well as in the formulation of printing inks and coatings, and overprint varnishes. The colored PET waste from flaked bottles represents a large fraction of the recycled PET volume and is especially useful from both an ecological and economical view.

De-Polymerization (Step A):

In the de-polymerization step, monohydric alcohols and/or glycols and/or other polyhydric alcohols dissolve the PET, and reduce the molecular weight by reaction with the alcohols. Mono- and/or polyhydric alcohols with a primary structure having one or two hydroxyl groups are preferred from the standpoint of rapid de-polymerization. One or a combination of two or more monohydrid and/or polyhydric alcohols may be used.

Suitable polyhydric alcohols include, but are not limited to, dihydric alcohols such as: decanol; 1,2-ethylene glycol; diethylene glycol; propylene glycol; dipropylene glycol; tripropylene glycol; 1,3-propanediol; polyethylene glycol; 2-methyl-1,3-propanediol; 1,2-butanediol; 1,3-butanediol; 1,4-butanediol; 1,6-hexanediol; 2,2-dimethyl-1,3-propanediol (neopentyl glycol); 2-butyl-2-ethyl-1,3-propanediol; 2,2,4-trimethyl-1,3-pentanediol; 3-methyl-1,5-pentanediol; ethoxylated neopentyl glycol; propoxylated neopentyl glycol; 1,4-cyclohexanedimethanol; bisphenol-A; ethoxylated bisphenol-A; hydrogenated bisphenol-A; or an alkylene oxide adduct of bisphenol-A.

Suitable polyhydric alcohols also include, but are not limited to, tri- or higher functional polyhydric alcohols, such as: glycerol, trimethylolpropane, ethoxylated trimethylolpropane, propoxylated trimethylolpropane, propoxylated glycerol, pentaerythritol, ethoxylated pentaerythritol, propoxylated pentaerythritol, di-trimethylolpropane, dipentaerythritol, ethoxylated dipentaerythritol, or sorbitol.

The monohydric or polyhydric alcohol for PET de-polymerization is selected appropriately depending on the molecular design, and the performance required. If desired, two or more kinds of monohydric and/or polyhydric alcohols can be used in combination.

A preferred ratio (by weight) of PET material to the sum of all monohydric and/or polyhydric alcohol in the de-polymerization step ranges from 20:1 to 1:10, preferably from 15:1 to 5:1. For example, the ratio of PET to polyhydric alcohol may be 20:1; or 15:1; or 10:1; or 5:1; or 2:1; or 1:1; or 1:2; or 1:5; or 1:10.

The PET de-polymerization with the monohydric and/or polyhydric alcohol(s) is preferably carried out at a temperature ranging from 160° C. to 270° C., preferably between 190° C. and 250° C., and more preferably between 215° C. and 235° C. For example, the de-polymerization may be run at a temperature from about 160° C. to about 260° C.; or about 160° C. to about 250° C.; or about 160° C. to about 225° C.; or about 160° C. to about 200° C.; or about 160° C. to about 175° C.; or about 170° C. to about 270° C.; or about 170° C. to about 260° C.; or about 170° C. to about 250° C.; or about 170° C. to about 225° C.; or about 170° C. to about 200° C.; or about 190° C. to about 270° C.; or about 190° C. to about 260° C.; or about 190° C. to about 250° C.; or about 190° C. to about 225° C.; or about 190° C. to about 200° C.

The de-polymerization step is carried out for about 2 to 12 hours, preferably 2 to 4 hours, or until the solid PET-mono- and/or polyhydric alcohol mixture converts to a clear or homogeneous mixture or melt-solution that contains no visible PET particles. For example, the de-polymerization step may be run for about 2 hours to about 10 hours; or about 2 hours to about 8 hours; or about 2 hours to about 6 hours.

Preferably, a catalyst is used to accelerate the de-polymerization. Examples of suitable catalysts include organic salts, such as zinc acetate; alkoxides, such as a titanium alkoxide; or chelates of metals. It is preferable to decide the type and the amount of the catalyst so as not to impair the physical properties of the resin. From this viewpoint, a preferred catalyst is a titanium or a tin compound, particularly a titanium alkoxode, e.g. titanium tetraisopropylate or titanium(IV)-tetrabutoxide. A preferred amount of the catalyst is from 0.01% to 2.50% by weight, based on the total weight of the de-polymerization mixture (i.e. PET+polyhydric alcohol(s)+catalyst). For example, the amount of catalyst may be 0.01% to 2.25%; or about 0.01% to about 2%; or about 0.01% to about 1.5%; or about 0.01% to about 1%; or about 0.01% to about 0.5%; or about 0.01% to about 0.1%; or about 0.1% to about 2.50%; or about 0.1% to about 2.25%; or about 0.1% to about 2%; or about 0.1% to about 1.5%; or about 0.1% to about 1%; or about 0.1% to about 0.5%; or about 0.5% to about 2.5%; or about 0.5% to about 2.25%; or about 0.5% to about 2%; or about 0.5% to about 1.5%; or about 0.5% to about 1%. The de-polymerization reaction can be carried out at atmospheric, sub-atmospheric, or supra-atmospheric pressure, but preferably is carried out at atmospheric pressure. The alcoholysis step is preferably carried out without removing the monohydric and/or polyhydric alcohol from the reaction mixture, in an effort to promote de-polymerization of PET to an oligomer. The order of addition can be: the PET is first melted, and then reacted; or the PET, for example as pellets, can be fed into hot, boiling monohydric and/or polyhydric alcohols.

The resulting PET de-polymerization product (PET polyol) ranges from a polymeric glass to a viscous liquid at standard conditions, depending on the amount and type of monohydric and/or polyhydric alcohols used. The color strongly depends on the quality of the PET material used. If the quality of recycled PET is very poor, for example multi-colored post-consumer PET scrap of bottles with some amount of insoluble impurities (like paper labels on the bottles or rub-off parts from cups collected in the process of mechanical cutting of the bottles), the PET depolymerization product can be filtered hot, for example at greater than 150° C., after step (A), but preferably the filtering is done after step (C) at the end of the synthesis.

Transesterification (Step B):

In step (B), the PET de-polymerization product obtained in step (A) is transesterified with a vegetable oil, fatty acid alkylester, or alkyd resin, into an oil-modified polyester polyol. The transesterification is preferably carried out at a temperature ranging from 160° C. to 270° C., more preferably between 230° C. and 260° C., and most preferably between 240° C. and 250° C. For example, the transesterification reaction can be carried out at a temperature of 160° C. to 260° C.; or 160° C. to 250° C.; or 160° C. to 240° C.; or 160° C. to 230° C.; or 160° C. to 200° C.; or 160° C. to 180° C.; or 200° C. to 270° C.; or 200° C. to 260° C.; or 200° C. to 250° C.; or 200° C. to 230° C.; or 220° C. to 270° C.; or 220° C. to 260° C.; or 220° C. to 250° C.; or 220° to 230° C.; or 230° C. to 270° C.; or 230° C. to 260° C.; or 230° C. to 250° C.; or 240° C. to 270° C.; or 240° C. to 260° C.; or 240° C. to 250° C.

The transesterification reaction is typically run for about 2 to 12 hours, preferably 2 to 5 hours. For example, the transesterification may be run for 2 to 10 hours; or 2 to 8 hours; or 2 to 5 hours; or 2 to 3 hours.

Examples of oils used in the transesterification can be one or more drying oils, semi-drying oils, or non-drying oils. Suitable examples of oils include, but are not limited to, almond oil, cacao oil, candlenut oil, castor oil, dehydrated castor oil, coconut oil, corn oil, cottonseed oil, grape seed oil, hempseed oil, linseed oil, olive oil, palm kernel oil, peanut oil, rapeseed oil, rice bran oil, safflower oil, sunflower oil, sesame oil, soybean oil, tall oil, tung oil and walnut oil, including combinations, and fatty acid esters, such as fatty acid alkyl esters thereof.

Alternatively, the oil can be one or more fatty acid alkylester, as for example, rapeseed methylester, rapeseed isopropylester, caprylic acid methylester, capric acid isoproplyester ester, laurylic acid methylester, myristic acid methylester, palmitic acid methylester, stearic acid methylester, oleic acid ethylester, erucic acid methylester, ricinoleic acid methyl ester, linoleic acid ethyl ester, linolenic acid methyl ester or palmitic acid isopropylester.

The oil component can also be introduced via an oil modified alkyd resin. Alkyds are polyesters modified by the addition of fatty acids and other components. In the resins and inks of the invention, the alkyds that are present typically have molecular weights ranging from 1,000 to about 20,000 Daltons.

An alkyd can, for example, be a reaction product between a polyhydric alcohol and an acid or anhydride. The alkyds can be modified with saturated or unsaturated fatty acids, preferably from plant and vegetable oils. Non-limiting examples of such fatty acids include sebatic acid, lauric acid, stearic acid, myristic acid, palmitic acid, oleic acid, linoleic acid, arachidic acid, behenic acid, erucic acid, linoleic acid, linoelaidic acid, eleostearic acid, timnodonic acid, arachidonic acid, ricinolic acid, ricinelaidic acid, versatic acid, citric acid, oxalic acid, malonic acid, succinic acid, glutaric acid, maleic acid, fumaric acid, phthalic acid, isophthalic acid, terephthalic acid, trimellitic acid or a combination thereof.

Re-Polymerization (Step C):

In the final step, the oil-modified polyester polyol containing reacted PET is further reacted with a mono- or polybasic acid or anhydride to adjust (usually increase) molecular weight, and adjust (usually decrease) hydroxyl group content.

For easier addition of the suitable amount of mono- and/or polybasic acid derivative(s) the transesterification product is optionally cooled to 150° C. or lower after step (B). This also avoids sublimation of monomers such as for example phthalic anhydride and the like.

The polybasic carboxylic acids which can be used in step (C) typically include unsaturated polybasic diacids, such as maleic acid, maleic anhydride, fumaric acid, and itaconic acid; aliphatic saturated polybasic acids, such as malonic acid, succinic acid, adipic acid, azelaic acid, and sebacic acid, aromatic saturated polybasic acids such as phthalic anhydride, isophthalic acid, terephthalic acid, trimellitic acid, and 2,6-naphthalene dicarboxylic acid.

A preferred acid derivative is a di-carboxy aromatic carboxylic acid anhydride. Suitable anhydrides include, but are not limited to, phthalic acid anhydride (PA), methylhexahydrophthalic acid anhydride (MHHPA), tetrahydrophthalic anhydride, 1,2-hexahydrophthalic anhydride, 1,4-cyclohexanedicarboxylic acid, nadic anhydride and trimellitic anhydride, and combinations thereof. Mixtures of the polybasic carboxylic acid derivatives, especially of PA and MHHPA, may also be used in all ratios. Alternatively, an aromatic alkylester can be used, such as terephthalic acid dimethyl ester.

The mono- and/or polybasic acid is usually added in an amount of 1 to 50%, preferably 2 to 25%, by weight based on the total weight of all reactants. For example, the polybasic acid may be added in an amount of 1% to 45%; or 1% to 40%; or 1% to 35%; or 1% to 30%; or 1% to 25%; or 1% to 20%; or 1% to 15%; or 1% to 10%; or 1% to 5%; or 2% to 50%; or 2% to 45%; or 2% to 40%; or 2% to 35%; or 2% to 30%; or 2% to 25%; or 2% to 20%; or 2% to 15%; or 2% to 10%; or 2% to 5%; or 5% to 50%; or 5% to 45%; or 5% to 40%; or 5% to 35%; or 5% to 30%; or 5% to 25%; or 5% to 20%; or 5% to 15%; or 5% to 10%. If necessary, monofunctional acids, such as benzoic acid, may also be added for viscosity adjustment and molecular weight control.

The reaction is preferably performed at 180° C. to 270° C. to start a dehydration and polycondensation reaction. For example, the reaction may be performed at 180° C. to 260° C.; or 180° C. to 250° C.; or 180° C. to 240° C.; or 180° C. to 230° C.; or 180° C. to 220° C.; or 180° C. to 210° C.; or 180° C. to 200° C.; or 200° C. to 270° C.; or 200° C. to 260° C.; or 200° C. to 250° C.; or 200° C. to 240° C.; or 200° C. to 230° C.; or 200° C. to 220° C.; or 200° C. to 210° C. The reaction is preferably done after the reaction atmosphere is sufficiently displaced with an inert gas, such as nitrogen. During the condensation, water is removed from the reaction mixture. To help remove formed water, the stream of gas is advantageous. The reaction is preferably done in the same vessel as in step (A) and (B) and without any work-up after step (A) and (B). The reaction can be done without catalyst, but in most cases the amount of catalyst left in the reaction mixture after step (B), is suitable to reduce conversion time. If not, further catalyst is added. Suitable are the same catalysts as listed for step (A) and (B), but not necessarily the same catalyst as in (A), is used for this step. Optionally, a vacuum is applied at a preferred pressure of 50,000-1,000 Pa, more preferred 20,000-500 Pa, in order to build up molecular weight and remove water and residuals.

The reaction is run until the acid value is reduced to the desired value. Preferably, the acid value of the liquid polyester resin is between 1 and 50 mg KOH/g, and more preferably between 2 and 10 mg KOH/g. For example, the acid value of the liquid polyester resin may be between 1 and 45 mg KOH/g; or between 1 and 40 mg KOH/g; or between 1 and 35 mg KOH/g; or between 1 and 30 mg KOH/g; or between 1 and 25 mg KOH/g; or between 1 and 20 mg KOH/g; or between 1 and 15 mg KOH/g; or between 1 and 10 mg KOH/g; or between 1 and 5 mg KOH/g; or between 1 and 2 mg KOH/g; or between 2 and 50 mg KOH/g; or between 2 and 45 mg KOH/g; or between 2 and 40 mg KOH/g; or between 2 and 35 mg KOH/g; or between 2 and 30 mg KOH/g; or between 2 and 25 mg KOH/g; or between 2 and 20 mg KOH/g; or between 2 and 15 mg KOH/g; or between 2 and 10 mg KOH/g; or between 2 and 5 mg KOH/g; or between 5 and 50 mg KOH/g; or between 5 and 45 mg KOH/g; or between 5 and 40 mg KOH/g; or between 5 and 35 mg KOH/g; or between 5 and 30 mg KOH/g; or between 5 and 25 mg KOH/g; or between 5 and 20 mg KOH/g; or between 5 and 15 mg KOH/g; or between 5 and 20 mg KOH/g.

The formed polyester resin ranges from a clear, transparent liquid, up to a highly viscous paste-like resin. The resin typically has a viscosity from 1 to 500 Pascal·seconds (Pa·s). For example, the resin may have a viscosity of 1 to 450 Pa·s; or 1 to 400 Pa·s; or 1 to 350 Pa·s; or 1 to 300 Pa·s; or 1 to 250 Pa·s; or 1 to 200 Pa·s; or 1 to 150 Pa·s; or 1 to 100 Pass; or 1 to 50 Pa·s; or 2 to 500 Pa·s; or 2 to 450 Pa·s; or 2 to 400 Pa·s; or 2 to 350 Pa·s; or 2 to 300 Pa·s; or 2 to 250 Pa·s; or 2 to 200 Pa·s; or 2 to 100 Pa·s; or 5 to 500 Pa·s; or 5 to 450 Pa·s; or 5 to 400 Pa·s; or 5 to 350 Pa·s; or 5 to 300 Pa·s; or 5 to 250 Pa·s; or 5 to 200 Pass; or 5 to 150 Pa·s; or 5 to 100 Pa·s.

The liquid polyester resin typically has a number average molecular weight between 800 and 5000 Daltons. For example, the resin may have a number average molecular weight between 800 and 4500 Daltons; or between 800 and 4000 Daltons; or between 800 and 3500 Daltons; or between 800 and 3000 Daltons; or between 800 and 2500 Daltons; or between 800 and 2000 Daltons; or between 800 and 1500 Daltons; or between 800 and 1000 Daltons; or between 1000 and 5000 Daltons; or between 1000 and 4500 Daltons; or between 1000 and 4000 Daltons; or between 1000 and 3500 Daltons; or between 1000 and 3000 Daltons; or between 1000 and 2500 Daltons; or between 1000 and 2000 Daltons.

The liquid polyester resin typically has a weight average molecular weight between 1500 and 10,000 Daltons. For example, the resin may have a weight average molecular weight between 1500 and 9500 Daltons; or between 1500 and 9000 Daltons; or between 1500 and 8500 Daltons; or between 1500 and 8000 Daltons; or between 1500 and 7500 Daltons; or between 1500 and 7000 Daltons; or between 1500 and 6500 Daltons; or between 1500 and 6000 Daltons; or between 1500 and 5500 Daltons; or between 1500 and 5000 Daltons; or between 1500 and 4500 Daltons; or between 1500 and 4000 Daltons; or between 1500 and 3500 Daltons; or between 1500 and 3000 Daltons; or between 1500 and 2500 Daltons; or between 1500 and 2000 Daltons; or between 2000 and 10,000 Daltons; or between 2000 and 9500 Daltons; or between 2000 and 9000 Daltons; or between 2000 and 8500 Daltons; or between 2000 and 8000 Daltons; or between 2000 and 7500 Daltons; or between 2000 and 7000 Daltons; or between 2000 and 6500 Daltons; or between 2000 and 6000 Daltons; or between 2000 and 5500 Daltons; 2000 and 5000 Daltons; or between 2000 and 4500 Daltons; or between 2000 and 4000 Daltons; or between 2000 and 3500 Daltons; or between 2000 and 3000 Daltons.

The color of the resin depends on the quality of the PET material and the color of the vegetable oil and/or fatty acid alkyl ester.

Usually, the formed PET polyester is soluble in toluene, aromatic and aliphatic mineral oils, vegetable oils, fatty acid alkyl esters, and triglycerides. The content of PET used in the synthesis can be up to 60 wt %, based on the total weight of all the components. Above 60 wt % the desired excellent solubility in the above-mentioned solvents is strongly reduced, and the material becomes soluble only in higher polar solvents such as ethyl acetate and acetone. For example, the PET may be used in an amount of 1 wt % to 60 wt %; or 1 wt % to 55 wt %; or 1 wt % to 50 wt %; or 1 wt % to 45 wt %; or 1 wt % to 40 wt %; or 1 wt % to 35 wt %; or 1 wt % to 30 wt %; or 1 wt % to 25 wt %; or 1 wt % to 20 wt %; or 1 wt % to 15 wt %; or 1 wt % to 10 wt %; or 1 wt % to 5 wt %; or 5 wt % to 60 wt %; or 5 wt % to 55 wt %; or 5 wt % to 50 wt %; or 5 wt % to 45 wt %; or 5 wt % to 40 wt %; or 5 wt % to 35 wt %; or 5 wt % to 30 wt %; or 5 wt % to 25 wt %; or 5 wt % to 20 wt %; or 5 wt % to 15 wt %; or 5 wt % to 10 wt %.

The method of the present invention may be carried out in batch or continuous mode, in an extruder for example. Optionally, the reaction steps of de-polymerization (A), transesterification (B), and pre-polymerization (C), are done in an inert atmosphere such as, for example, nitrogen or carbon dioxide.

The method of the present invention readily converts virgin, scrap, recycled or reclaimed PET into liquid polyester resins, which are value added material for ink and coating compositions, such as for lithographic inks. The liquid polyester resins of the present invention are suitable for use, for example, in lithographic sheet-fed inks, heat-set inks, and cold-set inks, letterpress inks, and lithographic overprint varnishes, and increase the overall amount of sustainable raw materials in an ink.

Ink and Coating Compositions and Overprint Varnishes

The ink and coating compositions of the present invention, which contain the polyester based on PET prepared according to the present invention, are made using typical procedures known in the art, usually by dry-grinding or using a base or flush. In a typical manufacturing procedure for inks, the required amount of dry pigment is mixed with the inventive oil-modified PET-polyester, mineral and vegetable oils, alkyd resins and varnishes containing hard resins, such as phenolic rosin resin or hydrocarbon resins, and additives, in a mixer for a sufficient time to wet out all pigment (the pre-mix). The pre-mix is then ground on a three roll mill (or other grinding mill at a pressure of about 1 to 5 MPa, and at a temperature of about 20° C. to about 40° C., until the desired grind specifications are met. Finally, viscosity, tack, and flow can be adjusted at a post blend station, if necessary.

The liquid polyester resin of the invention is typically present in the ink and coating compositions, or overprint varnishes, in an amount from about 1 wt % to about 60 wt %, based on the total weight of the ink or coating composition, or overprint varnish. For example, the liquid polyester resin may be present in the ink or coating composition, or overprint varnish, in an amount of from about 1 wt % to 55 wt %; or 1 wt % to 50 wt %; or 1 wt % to 45 wt %; or 1 wt % to 40 wt %; or 1 wt % to 35 wt %; or 1 wt % to 30 wt %; or 1 wt % to 25 wt %; or 1 wt % to 20 wt %; or 1 wt % to 15 wt %; or 1 wt % to 10 wt %; or 1 wt % to 5 wt %; or 5 wt % to 60 wt %; or 5 wt % to 55 wt %; or 5 wt % to 50 wt %; or 5 wt % to 45 wt %; or 5 wt % to 40 wt %; or 5 wt % to 35 wt %; or 5 wt % to 30 wt %; or 5 wt % to 25 wt %; or 5 wt % to 20 wt %; or 5 wt % to 15 wt %; or 5 wt % to 10 wt %.

The ink and coating compositions of the present invention may contain one or more colorants, in the form of a dye, or organic or inorganic pigment dispersed therein. Suitable dyes include, but are not limited to: azo dyes, anthraquinone dyes, xanthene dyes, azine dyes, and combinations thereof. Suitable pigments include, but are not limited to: Pigment Yellow 1, Pigment Yellow 3, Pigment Yellow 12, Pigment Yellow 13, Pigment Yellow 14, Pigment Yellow 17, Pigment Yellow 63, Pigment Yellow 65, Pigment Yellow 73, Pigment Yellow 74, Pigment Yellow 75, Pigment Yellow 83, Pigment Yellow 97, Pigment Yellow 98, Pigment Yellow 106, Pigment Yellow 111, Pigment Yellow 114, Pigment Yellow 121, Pigment Yellow 126, Pigment Yellow 127, Pigment Yellow 136, Pigment Yellow 138, Pigment Yellow 139, Pigment Yellow 174, Pigment Yellow 176, Pigment Yellow 188, Pigment Yellow 194, Pigment Orange 5, Pigment Orange 13, Pigment Orange 16, Pigment Orange 34, Pigment Orange 36, Pigment Orange 61, Pigment Orange 62, Pigment Orange 64, Pigment Red 2, Pigment Red 9, Pigment Red 14, Pigment Red 17, Pigment Red 22, Pigment Red 23, Pigment Red 37, Pigment Red 38, Pigment Red 41, Pigment Red 42, Pigment Red 48: 2, Pigment Red 53: 1, Pigment Red 57: 1, Pigment Red 81: 1, Pigment Red 112, Pigment Red 122, Pigment Red 170, Pigment Red 184, Pigment Red 210, Pigment Red 238, Pigment Red 266, Pigment Blue 15, Pigment Blue 15: 1, Pigment Blue 15: 2, Pigment Blue 15: 3, Pigment Blue 15: 4, Pigment Blue 61, Pigment Green 7, Pigment Green 36, Pigment Violet 1, Pigment Violet 19, Pigment Violet 23, Pigment Black 7, and combinations thereof. Non-limiting examples of inorganic pigments include iron oxides, titanium dioxides, chromium oxides, ferric ammonium ferrocyanides, ferric oxide blacks, Pigment Black Number 7 and/or Pigment White Numbers 6 and 7. Other organic and inorganic pigments and dyes can also be employed, as well as combinations that achieve the colors desired.

Dyes and organic pigments are typically present in the ink or coating compositions in an amount of about 0.1 wt % to about 30 wt %, based on the total weight of the ink or coating composition. For example, dyes and organic pigments may be present in an amount of about 0.1 wt % to about 25 wt %; or 0.1 wt % to 20 wt %; or 0.1 wt % to 15 wt %; or 0.1 wt % to 10 wt %; or 0.1 wt % to 5 wt %; or 0.1 wt % to 1 wt %; or 0.5 wt % to 30 wt %; or 0.5 wt % to 25 wt %; or 0.5 wt % to 20 wt %; or 0.5 wt % to 15 wt %; or 0.5 wt % to 10 wt %; or 0.5 wt % to 5 wt %; or 0.5 wt % to 1 wt %; or 1 wt % to 30 wt %; or 1 wt % to 25 wt %; or 1 wt % to 20 wt %; or 1 wt % to 15 wt %; or 1 wt % to 10 wt %; or 1 wt % to 5 wt %; or 5 wt % to 30 wt %; or 5 wt % to 25 wt %; or 5 wt % to 20 wt %; or 5 wt % to 15 wt %; or 5 wt % to 10 wt %.

Inorganic pigments are typically present in the ink or coating compositions in an amount of about 0.1 wt % to about 40 wt %, based on the total weight of the ink or coating composition. For example, inorganic pigments may be present in an amount of about 0.1 wt % to about 35 wt %; or 0.1 wt % to 30 wt %; 0.1 wt % to about 25 wt %; or 0.1 wt % to 20 wt %; or 0.1 wt % to 15 wt %; or 0.1 wt % to 10 wt %; or 0.1 wt % to 5 wt %; or 0.1 wt % to 1 wt %; or 0.5 wt % to 40 wt %; or 0.5 wt % to 35 wt %; or 0.5 wt % to 30 wt %; or 0.5 wt % to 25 wt %; or 0.5 wt % to 20 wt %; or 0.5 wt % to 15 wt %; or 0.5 wt % to 10 wt %; or 0.5 wt % to 5 wt %; or 0.5 wt % to 1 wt %; or 1 wt % to 40 wt %; or 1 wt % to 35 wt %; or 1 wt % to 30 wt %; or 1 wt % to 25 wt %; or 1 wt % to 20 wt %; or 1 wt % to 15 wt %; or 1 wt % to 10 wt %; or 1 wt % to 5 wt %; or 5 wt % to 40 wt %; or 5 wt % to 35 wt %; or 5 wt % to 30 wt %; or 5 wt % to 25 wt %; or 5 wt % to 20 wt %; or 5 wt % to 15 wt %; or 5 wt % to 10 wt %.

The ink and coating compositions, or overprint varnishes, of the invention may also contain one or more alkyd resins, vegetable oils, mineral oils, or fatty acid alkyl esters, or varnishes of hard resins. A hard resin is typically a natural or synthetic, amorphous material, which, for the purposes of the present invention, preferably forms a tack-free film at room temperature after application to a substrate. Most of these materials are oligomers or polymers. Any hard resin that is compatible with and/or soluble in the liquid oil-modified PET polyester resin of the invention, oils, and alkyd resins can be used in the ink and coating compositions, or overprint varnishes, of the present invention. Examples of preferred hard resins include rosin resin derivatives, which consist of a variety of isomers and different chemical structures, such as derivatives of abietic acid, levopimaric acid, neoabietic acid, palustric acid, dehydroabietic acid, pimaric acid and isopimaric acid. The rosin derivative can be modified with maleic anhydride or fumaric acid and esterified with polyols such as glycerol and pentaerythritol, or a phenolic rosin resin. The hard resin can also be a hydrocarbon resin or modified aliphatic, aromatic or hybrid hydrocarbon resins or a rosin resin, preferred are phenolic rosin resins.

When present, alkyd resins are typically present in the ink and coating compositions, or overprint varnishes, in an amount of about 0.1 wt % to about 30 wt %, based on the total weight of the ink or coating composition, or overprint varnish. For example, alkyd resins may be present in the ink and coating compositions, or overprint varnishes, in an amount of from about 0.1 wt % to about 25 wt %; or 0.1 wt % to 20 wt %; or 0.1 wt % to 15 wt %; or 0.1 wt % to 10 wt %; or 0.1 wt % to 5 wt %; or 0.1 wt % to 1 wt %; or 0.5 wt % to 30 wt %; or 0.5 wt % to 25 wt %; or 0.5 wt % to 20 wt %; or 0.5 wt % to 15 wt %; or 0.5 wt % to 10 wt %; or 0.5 wt % to 5 wt %; or 0.5 wt % to 1 wt %; or 1 wt % to 30 wt %; or 1 wt % to 25 wt %; or 1 wt % to 20 wt %; or 1 wt % to 15 wt %; or 1 wt % to 10 wt %; or 1 wt % to 5 wt %; or 5 wt % to 30 wt %; or 5 wt % to 25 wt %; or 5 wt % to 20 wt %; or 5 wt % to 15 wt %; or 5 wt % to 10 wt %.

When present, vegetable oils are typically present in the ink and coating compositions, or overprint varnishes, in an amount of about 0.1 wt % to about 40 wt %, based on the total weight of the ink or coating composition, or overprint varnish. For example, vegetable oils may be present in an amount of about 0.1 wt % to about 35 wt %; or 0.1 wt % to 30 wt %; 0.1 wt % to about 25 wt %; or 0.1 wt % to 20 wt %; or 0.1 wt % to 15 wt %; or 0.1 wt % to 10 wt %; or 0.1 wt % to 5 wt %; or 0.1 wt % to 1 wt %; or 0.5 wt % to 40 wt %; or 0.5 wt % to 35 wt %; or 0.5 wt % to 30 wt %; or 0.5 wt % to 25 wt %; or 0.5 wt % to 20 wt %; or 0.5 wt % to 15 wt %; or 0.5 wt % to 10 wt %; or 0.5 wt % to 5 wt %; or 0.5 wt % to 1 wt %; or 1 wt % to 40 wt %; or 1 wt % to 35 wt %; or 1 wt % to 30 wt %; or 1 wt % to 25 wt %; or 1 wt % to 20 wt %; or 1 wt % to 15 wt %; or 1 wt % to 10 wt %; or 1 wt % to 5 wt %; or 5 wt % to 40 wt %; or 5 wt % to 35 wt %; or 5 wt % to 30 wt %; or 5 wt % to 25 wt %; or 5 wt % to 20 wt %; or 5 wt % to 15 wt %; or 5 wt % to 10 wt %.

When present, varnishes of hard resins are typically present in the ink and coating compositions, or overprint varnishes, in an amount of about 0.1 wt % to about 30 wt %, based on the total weight of the ink or coating composition, or overprint varnish. For example, varnishes of hard resins may be present in an amount of about 0.1 wt % to about 25 wt %; or 0.1 wt % to 20 wt %; or 0.1 wt % to 15 wt %; or 0.1 wt % to 10 wt %; or 0.1 wt % to 5 wt %; or 0.1 wt % to 1 wt %; or 0.5 wt % to 30 wt %; or 0.5 wt % to 25 wt %; or 0.5 wt % to 20 wt %; or 0.5 wt % to 15 wt %; or 0.5 wt % to 10 wt %; or 0.5 wt % to 5 wt %; or 0.5 wt % to 1 wt %; or 1 wt % to 30 wt %; or 1 wt % to 25 wt %; or 1 wt % to 20 wt %; or 1 wt % to 15 wt %; or 1 wt % to 10 wt %; or 1 wt % to 5 wt %; or 5 wt % to 30 wt %; or 5 wt % to 25 wt %; or 5 wt % to 20 wt %; or 5 wt % to 15 wt %; or 5 wt % to 10 wt %.

The ink and coating compositions, and overprint varnishes, of the present invention may further contain one or more of the usual additives to modify flow, surface tension, gloss, pigment wetting, and abrasion and solvent resistance of the printed ink or coating composition. Such additives are typically surface-active agents, waxes, shelf-life stabilizers, etc., and combinations. These additives may function as leveling agents, shelf-life stabilizers, wetting agents, slip agents, flow agents, dispersants, and de-aerators. When present, the additives are typically present in an amount of about 0.1 wt % to about 5 wt %, based on the total weight of the ink or coating composition, or overprint varnish. For example, the one or more additives may be present in an amount of about 0.1 wt % to about 4.5 wt %; or about 0.1 wt % to about 4 wt %; or about 0.1 wt % to about 3.5 wt %; or about 0.1 wt % to about 3 wt %; or about 0.1 wt % to about 2.5 wt %; or about 0.1 wt % to about 2 wt %; or about 0.1 wt % to about 1.5 wt %; or about 0.1 wt % to about 1 wt %; or about 0.1 wt % to about 0.5 wt %; or about 0.5 wt % to about 5 wt %; or about 0.5 wt % to about 4.5 wt %; or about 0.5 wt % to about 4 wt %; or about 0.5 wt % to about 3.5 wt %; or about 0.5 wt % to about 3 wt %; or about 0.5 wt % to about 2.5 wt %; or about 0.5 wt % to about 2 wt %; or about 0.5 wt % to about 1.5 wt %; or about 0.5 wt % to about 1 wt %.

In order to avoid premature polymerization of the double bonds in the oils and alkyd resins, one or more antioxidants can be added to the ink and coating compositions, or overprint varnishes, of the present invention. Exemplary anti-oxidants include ascorbic acid; astaxanthin; carotene; chroman (3,4-dihydro-2H-1-benzopyran); hexamethylene bis(3,5-di-tert-butyl-4-hydroxyhydro-cinnamate); octadecyl 3,5-di-tert-butyl-4-hydroxyhydro-cinnamate; vitamin E and vitamin E analogs; mono-tert-butylhydroquinone (MTBHQ); butylated hydroxy toluene (BHT); 1,4-dihydroxybenzene (HQ); and 6,6'-di-tert-butyl-2,2'-methylene-di-p-cresol. Preferred anti-oxidants are MTBHQ and BHT. When present, the antioxidants are typically present in an amount of about 0.1 wt % to about 5 wt %, based on the total weight of the ink or coating composition, or overprint varnish. For example, the antioxidants may be present in an amount of about 0.1 wt % to about 4.5 wt %; or about 0.1 wt % to about 4 wt %; or about 0.1 wt % to about 3.5 wt %; or about 0.1 wt % to about 3 wt %; or about 0.1 wt % to about 2.5 wt %; or about 0.1 wt % to about 2 wt %; or about 0.1 wt % to about 1.5 wt %; or about 0.1 wt % to about 1 wt %; or about 0.1 wt % to about 0.5 wt %; or about 0.5 wt % to about 5 wt %; or about 0.5 wt % to about 4.5 wt %; or about 0.5 wt % to about 4 wt %; or about 0.5 wt % to about 3.5 wt %; or about 0.5 wt % to about 3 wt %; or about 0.5 wt % to about 2.5 wt %; or about 0.5 wt % to about 2 wt %; or about 0.5 wt % to about 1.5 wt %; or about 0.5 wt % to about 1 wt %.

In order to accelerate the drying of oils and alkyds, the ink or coating compositions, or overprint varnishes, may contain one or more dryers, which are typically fatty acid salts, such as salts of organic carboxylic acids, of heavy metals such as cobalt and manganese, e.g., cobalt/manganese linoleate, hexadecanoate or octoate (e.g., see U.S. Pat. Nos. 5,156,674; 6,899,756; 7,811,367). The drier can be any of the commercially available metal driers, such as those based on cobalt or manganese or cobalt/manganese combinations. A number of cobalt/manganese driers are commercially available as cobalt/manganese linoleate, hexadecanoate or octoate. Preferred is a cobalt-free dryer. When present, the dryers are typically present in an amount of 0.1 wt % to about 5 wt %, based on the total weight of the ink or coating composition, or overprint varnish. For example, the dryers may be present in an amount of about 0.1 wt % to about 4.5 wt %; or about 0.1 wt % to about 4 wt %; or about 0.1 wt % to about 3.5 wt %; or about 0.1 wt % to about 3 wt %; or about 0.1 wt % to about 2.5 wt %; or about 0.1 wt % to about 2 wt %; or about 0.1 wt % to about 1.5 wt %; or about 0.1 wt % to about 1 wt %; or about 0.1 wt % to about 0.5 wt %; or about 0.5 wt % to about 5 wt %; or about 0.5 wt % to about 4.5 wt %; or about 0.5 wt % to about 4 wt %; or about 0.5 wt % to about 3.5 wt %; or about 0.5 wt % to about 3 wt %; or about 0.5 wt % to about 2.5 wt %; or about 0.5 wt % to about 2 wt %; or about 0.5 wt % to about 1.5 wt %; or about 0.5 wt % to about 1 wt %.

The ink and coating compositions, or overprint varnishes, of the present invention may further contain the usual extenders or fillers such as, but not limited to, clay, talc, calcium carbonate, magnesium carbonate or silica to adjust water uptake, misting, and color strength. When present, the extenders are typically present in an amount of about 0.1 wt % to about 30 wt %, based on the total weight of the ink or coating composition, or overprint varnish. For example, the extenders may be present in an amount of about 0.1 wt % to about 25 wt %; or 0.1 wt % to 20 wt %; or 0.1 wt % to 15 wt %; or 0.1 wt % to 10 wt %; or 0.1 wt % to 5 wt %; or 0.1 wt % to 1 wt %; or 0.5 wt % to 30 wt %; or 0.5 wt % to 25 wt %; or 0.5 wt % to 20 wt %; or 0.5 wt % to 15 wt %; or 0.5 wt % to 10 wt %; or 0.5 wt % to 5 wt %; or 0.5 wt % to 1 wt %; or 1 wt % to 30 wt %; or 1 wt % to 25 wt %; or 1 wt % to 20 wt %; or 1 wt % to 15 wt %; or 1 wt % to 10 wt %; or 1 wt % to 5 wt %; or 5 wt % to 30 wt %; or 5 wt % to 25 wt %; or 5 wt % to 20 wt %; or 5 wt % to 15 wt %; or 5 wt % to 10 wt %.

Typically, the ink and coating compositions, and overprint varnishes, of the present invention have a viscosity of about 5 to 300 Pa·s, at a shear rate of D=50 1/s. A preferred viscosity is about 20 to 110 Pa·s. For example, the ink and coating compositions, or overprint varnishes, may have a viscosity of about 5 to 290 Pa·s; or 5 to 280 Pa·s; or 5 to 270 Pa·s; or 5 to 260 Pa·s; or 5 to 250 Pa·s; or 5 to 240 Pa·s; or 5 to 230 Pa·s; or 5 to 220 Pass; or 5 to 210 Pa·s; or 5 to 200 Pa·s; or 5 to 190 Pa·s; or 5 to 180 Pa·s; or 5 to 170 Pa·s; or 5 to 160 Pa·s; or 5 to 150 Pa·s; or 5 to 140 Pa·s; or 5 to 130 Pa·s; or 5 to 120 Pa·s; or 5 to 110 Pa·s; or 5 to 100 Pa·s; or 10 to 300 Pa·s; or 10 to 290 Pa·s; or 10 to 280 Pa·s; or 10 to 270 Pa·s; or 10 to 260 Pa·s; or 10 to 250 Pa·s; or 10 to 240 Pa·s; or 10 to 230 Pa·s; or 10 to 220 Pa·s; or 10 to 210 Pa·s; or 10 to 200 Pa·s; or 10 to 150 Pa·s; or 10 to 140 Pa·s; or 10 to 130 Pa·s; or 10 to 120 Pa·s; or 10 to 110 Pa·s; or 10 to 100 Pa·s; or 20 to 300 Pa·s; or 20 to 290 Pa·s; or 20 to 280 Pa·s; or 20 to 270 Pa·s; or 20 to 260 Pa·s; or 20 to 250 Pa·s; or 20 to 240 Pa·s; or 20 to 230 Pa·s; or 20 to 220 Pa·s; or 20 to 210 Pa·s; or 20 to 200 Pa·s. Typical values for flow rate of the ink and coating compositions, or overprint varnishes, are about 3 to 15 cm after 15 minutes, measured with a vertical aluminum plate with 0.5 ml of the ink or coating composition, or overprint varnish.

The substrate to be printed on may be composed of any typical substrate material such as paper, plastics, metals, and composites. The preferred substrate is paper print stock, typically used for publications and packaging material in the form of a cardboard sheet or board.

EXAMPLES

The following examples illustrate specific aspects of the present invention, and are not intended to limit the scope thereof in any respect and should not be so construed.

Determination of Acid Value of Liquid Polyester Resins

A 0.2 to 1.0 g sample of the liquid polyester resin was weighed into a clean 50 ml Erlenmeyer flask, and dissolved in acetone (10 to 20 ml), ensuring that all sample material was dissolved. Three drops of 1% alcoholic phenolphthalein solution was added to the resin solution. The resin solution was titrated with standardized 0.1 N alcoholic potassium hydroxide (KOH) to the first pink color, which lasted for about 15 seconds, and the number of mls of KOH used was recorded.

The acid value was calculated according to:

$$\text{Acid number (mg KOH/g)} = \frac{(\text{ml KOH}) \times (0.1) \times (56.1)}{\text{Sample weight (g)}}$$

Determination of Methanol Number

Methanol compatibility is an indication of the polarity of a material. The test samples (here liquid polyester resins) were first dissolved in toluene, and then titrated with anhydrous methanol until the solution became cloudy. A 10% solution of the inventive liquid polyester resin in toluene was titrated with pure methanol until the solution became turbid (cloudy). The number of ml of methanol until turbidity occurred was taken as the methanol number.

Determination of Molecular Weight of Liquid Polyester Resins

Number average molecular weight ($M_n$) and mass average molecular weight ($M_w$) were determined by size exclusion chromatography (GPC) with monodisperse polystyrene equivalent molecular weight calibration standard and GPC columns G1000HXL, G500HXLxl, and G100HXLxl (manufactured by Tosoh Corp.) The flow rate was 1.0 ml/min, the eluent was tetrahydrofurane, and the column temperature was 40° C. A differential refractive index detector (RI) and a UV-detector (254 nm) were used. The polydispersity was calculated from the measurement results. The formula for polydispersity (PD) is $M_w/M_n$.

Determination of Rheological Properties

Viscosity was measured with a Physika 300 cone and plate rheometer from Anton Parr GmbH, at a shear rate of D=2 to 100 l/s. The viscosity value at D=50 l/s was recorded. Unless otherwise specified, viscosity was measured at 25° C. Cone and plate viscosity is reported as Pascals·second (Pa·s).

Laray viscosity was measured using an IGT Laray viscosimeter. The Laray viscometer determines the viscosity of a wide range of viscous materials. It measures the relative velocity of two parallel surfaces, separated by a thin film of the measured viscous material when a certain force (weight of rod) is applied on one of the surfaces. The movement is hindered by the viscosity of the measured material and the travel time of the surface over a certain distance was measured. Laray viscosity is reported in either Poise (P) or Pascal·seconds (Pa·s), as indicated in the results tables.

Yield value was determined with a Physika 300 cone and plate rheometer from Anton Parr GmbH. When using the cone and plate rheometer, the yield value was the measured viscosity value at a shear rate of D=2 1/s. With a Laray viscosimeter, the yield value is taken at a shear rate of D=2.5 l/s.

Shortness ratio was measured as the viscosity value at a shear rate of D=2 l/s divided by the viscosity value at a shear rate of D=50 l/s.

Flow was measured by placing 1 ml of ink on top of vertical aluminum plate, and measuring the distance, in cm or mm (indicated in results tables), the ink traveled down the plate (by gravity) within 15 minutes.

Softening Point

Softening point was determined by the ring and ball method (according to ISO 4625 or ASTM E28-67/E28-99). The ring and ball method briefly consists of determining the temperature at which a disk of the hard resin held in a ring and loaded with a ball will flow through a definite distance when heated at a prescribed rate.

Cloud Point

Cloud point was measured using a Cloud-o-scope from IGT Company. The cloud point is the temperature at which a heated, homogeneous resin/oil mixture starts to become cloudy when it is being cooled down again. The cloud point temperature is a characteristic value in the quality control of synthetic resins for printing inks. The method used herein is according to the method described in ASTM D6038.

Color

Color (Gardner color scale) was determined with a Hellige color comparator. The color of a resin filled tube (1×1×10 cm) was compared to a defined color scale until the corresponding color matched the resin color.

Tack

Tack was measured with a calibrated Tack-o-scope instrument (Model 2001) from IGT Testing Systems, Netherlands. One ml of ink was placed on the rubber distribution roller at 30° C., distributed for 90 seconds at a roller speed of 50 rpm, then 30 seconds at 300 rpm. The tack value ws then taken at a roller speed of 150 rpm.

Gloss

Gloss was measured with a Byk-Gardner micro-gloss instrument at an angle of 60°.

Adhesion

Adhesion was measured using the Standard Test Method for Measuring Adhesion by Tape Test (ASTM D3359-8, Method B). Adhesion was scored on a scale of 0% to 100% (percentage of ink remaining on the substrate), wherein a score of 100% is best, meaning that 100% of the ink remained on the substrate.

Example 1. Synthesis of a Soybean Oil-Modified Polyester Resin Based on Recycled Multicolor PET Flakes 44.3 lb. of recycled multicolor PET bottle flakes (Lybra, Plastic Providers Company, US), 16.98 lb. of propylene glycol industrial grade (Dow Chemical), and 0.44 lbs. of titanium tetraisopropylate (Dorf Ketal) were charged into a stainless steel reactor, equipped with heating mantle, stirrer, feeding tank, condenser, and receiver, and inserted with nitrogen gas. Then, the temperature was increased to T=230° C. When all recycled PET ws molten, stirring was started and continued until all PET was dissolved, which took about 3 hours. Then, 64.4 lb. of refined soybean oil (Oleon) was added at rate so that the temperature did not fall under 200° C., in order to avoid solidification. After 15 minutes, all oil was added and the temperature was increased to T=240° C., and held under stirring for 2 hours. Then, the temperature was lowered to 150° C. and 21.5 lb. of phthalic anhydride was added. After a period of 1 hour the temperature was increased slowly to 250° C., and slight vacuum (200-500 mbar) was applied. The reaction was continued under collection of distillate (~2.8 lb.) until the acid value reached 12 mg KOH/g. Then, the hot resin was discharged, filtered through a 150 μm filter-bag and drummed.

Characterization:
Acid value: 12 mg KOH/g
Viscosity: 23 Pa·s at 25° C.
Gardner color: 12
Molecular weight ($M_n/M_w$): 1350/2750

Example 2. Synthesis of Soybean Oil-Modified Polyester Resin Based on Recycled Multicolor PET-Grind 100.0 g of recycled hot washed multicolor PET bottle grind (STF-fines, STF-Recycling), 40.0 g of propylene glycol (Aldrich), and 1.0 g of titanium tetraisopropylate (Dorf Ketal) were charged into an glass reactor, equipped with heating mantle, stirrer, feeding tank, condenser and receiver and inerted with nitrogen gas. Then, the temperature was increased to T=230° C. When all recycled PET was molten, stirring was started and continued until all PET was dissolved, which took about 3 hours. Then, 150.0 g of refined soybean oil (Oleon) was added at rate so that the temperature did not fall under 200° C., in order to avoid solidification. After 5 minutes, all oil was added and the temperature was increased to T=240° C., and held under stirring for 2 hours. Then, the temperature was lowered to 150° C. and 50.0 g of phthalic anhydride was added. After a period of 1 hour the temperature was increased slowly to 250° C., and slight vacuum (200-500 mbar) was applied. The reaction was continued under collection of distillate until the acid value reached 10 mg KOH/g. Then, the hot resin was discharged and filtered through a 100 μm metal mesh.

Characterization:
Acid value: 9 mg KOH/g
Viscosity: 26 Pa·s at 25° C.
Gardner color: 12-13
Molecular weight ($M_n/M_w$): 2050/4750

Examples 3 to 5. Consistency of Soybean Oil-Modified Polyester Resins Based on Recycled Clear PET Pellets Examples 3 to 5 were prepared in the same manner as Example 2, except that recycled, clear, colorless PET pellets for polyester yarn making (WSR 484, WSR Recycling) were used instead of the PET bottle grind. The characteristics of the resulting resins are shown in Table 1.

TABLE 1

Characterization of Examples 3 to 5

| | Acid value [mg KOH/g] | Molecular weight [$M_n/M_w$] UV detector 254 nm | Viscosity [Pa · s] @25° C. | Color [Gardner units] |
|---|---|---|---|---|
| Example 3 | 15 | 1363/2960 | 19.5 | 13 |
| Example 4 | 16 | 1390/2481 | 19.1 | 13 |
| Example 5 | 17 | 1286/2205 | 18.0 | 13 |

As shown in Table 1, the liquid polyester resins of the invention can be manufactured by the methods of the invention with a high consistency, described by the narrow specification of acid value, molecular weight, and viscosity.

Example 6. Synthesis of Coconut Oil-Modified Polyester Resin Based on PET 100.0 g of recycled hot washed multicolor PET bottle grind (STF-fines, STF-Recycling), 40.0 g of propylene glycol (Dow Chemical), and 1.0 g of titanium tetraisopropylate (Dorf Ketal) were charged into an glass reactor, equipped with heating mantle, stirrer, feeding tank, condenser, and receiver, and inerted with nitrogen gas. Then, the temperature was increased to T=230° C. When all recycled PET was molten, stirring was started and continued until all PET was dissolved, which took about 3 hours. Then, 150.0 g of coconut oil (Oleon) was added at rate so that the temperature did not fall under 200° C., in order to avoid solidification. After 5 minutes, all oil was added and the temperature was increased to T=240° C. and held under stirring for 2 hours. Then, the temperature was lowered to 150° C. and 50.0 g of phthalic anhydride was added. After a period of 1 hour the temperature was increased slowly to 250° C., and slight vacuum (200-500 mbar) was applied. The reaction was continued under collection of distillate until the acid value reached 10 mg KOH/g. Then, the hot resin was discharged and filtered through a 100 μm metal sieve.

Characterization:
Acid value: 9 mg KOH/g
Viscosity: 23 Pa·s at 25° C.
Gardner color: 9-10
Molecular weight ($M_n/M_w$): 1530/2640

Example 7. Synthesis of Linseed Oil-Modified Polyester Resin Based on PET 100.0 g of recycled multicolor PET bottle flakes (Multi-PET), 40.0 g of propylene glycol (Sigma-Aldrich), and 1.0 g of titanium tetraisopropylate (Dorf Ketal) were charged into a glass reactor, equipped with heating mantle, stirrer, feeding tank, condenser and receiver and inerted with nitrogen gas. Then, the temperature was increased to T=230° C. When all recycled PET was molten, stirring was started and continued until all PET was dissolved, which took about 3 hours. Then, 150.0 g of linseed oil (Oleon) was added at rate so that the temperature did not fall under 200° C., in order to avoid solidification. After 5 minutes, all oil was added and the temperature was increased to T=240° C. and held under stirring for 2 hours. Then, the temperature was lowered to 150° C. and 50.0 g of phthalic anhydride (Sigma-Aldrich) was added. After a period of 1 hour the temperature was increased slowly to 250° C., and slight vacuum (200-500 mbar) was applied. The reaction was continued under collection of distillate until the acid value reached 10 mg KOH/g. Then, the hot resin was discharged and filtered through a 150 μm filter-bag and drummed.

Characterization:
Acid value: 8 mg KOH/g
Viscosity: 23 Pa·s at 25° C.
Gardner Color: 9
Molecular weight ($M_n/M_w$): 1659/3250

Example 7b. Synthesis of Rapeseed Oil-Modified Polyester Resin Based on PET 100.0 g of recycled PET-N-nature flakes (Kruschitz company, Austria), 40.0 g of propylene glycol (Sigma-Aldrich) and 1.0 g of titanium tetraisopropylate (Dorf Ketal) were charged into a glass reactor, equipped with heating mantle, stirrer, feeding tank, condenser, and receiver, and inerted with nitrogen gas. Then, the temperature was increased to T=230° C. When all recycled PET was molten, stirring was started and continued until all PET was dissolved, which took about 3 hours. Then, 150.0 g of rapeseed cooking oil (Aldi) was added at rate so that the temperature did not fall under 200° C., in order to avoid solidification. After 5 minutes, all oil was added and the temperature was increased to T=245° C. and held under stirring for 2 hours. Then, the temperature was lowered to 150° C. and 50.0 g of phthalic anhydride (Sigma-Aldrich) was added. After a period of 1 hour the temperature was increased slowly to 250° C., and slight vacuum (200-500 mbar) was applied. The reaction was continued under collection of distillate until the acid value reached 15 mg KOH/g. Then, the hot resin was discharged and filtered through a 150 μm filter-bag and drummed.

Characterization:
Acid value: 14 mg KOH/g
Viscosity: 21 Pa·s @25° C.
Gardner Color: 5-6
Molecular weight ($M_n/M_w$): 1459/2950

Example 8. Lithographic Sheet-Fed Inks Containing Liquid Polyester Resins

Four lithographic sheet-fed inks, Ex. 8A to 8D (yellow, magenta, cyan, black), were made, containing the liquid polyester resin of Example 1. The general procedure described above, using a dry-grind, was used. The formulations are given in Table 2a. The ink properties are shown in Table 2b.

TABLE 2a

Formulations of lithographic sheet-fed inks

| Raw materials | Ex. 8A Yellow [weight %] | Ex. 8B Magenta [weight %] | Ex. 8C Cyan [weight %] | Ex. 8D Black [weight %] |
|---|---|---|---|---|
| Soybean oil based varnish (India sourced) | 39.00 | 47.03 | 34.70 | 35.82 |
| Alkyd resin (Lawter) | 3.80 | | 6.12 | 14.92 |
| C-18 fatty acid methyl ester | 3.00 | 4.02 | 2.55 | 1.99 |
| Pigment Yellow 174 | 9.60 | | | |
| Pigment Red 57:1 | | 14.07 | | |
| Pigment Blue 15:3 | | | 12.44 | 0 |
| Pigment Black 7 | | | | 20.89 |
| Extender | 6.00 | 3.02 | 3.06 | 2.98 |
| Soybean oil based varnish (India sourced) | 23.80 | 21.91 | 31.02 | 7.17 |
| Example 1 Inventive polyester resin | 10.00 | 6.53 | 6.33 | 9.97 |
| Polyethylene wax compound | 1.50 | 1.51 | 1.84 | 1.79 |
| Ink stabilizer Antioxidant | 0.80 | 0.80 | 0.82 | 0.49 |
| ORANGE 13 colorant | 0.60 | | | |
| Linseed oil methyl ester | 0.80 | | | 2.49 |
| Oxidative Dryer | 1.10 | 1.11 | 1.12 | 1.49 |
| Total | 100.00 | 100.00 | 100.00 | 100.00 |

TABLE 2b

Ink properties of lithographic sheet-fed inks

| Ink properties | Ex. 8A Yellow [weight %] | Ex. 8B Magenta [weight %] | Ex. 8C Cyan [weight %] | Ex. 8D Black [weight %] |
|---|---|---|---|---|
| Viscosity @ shear rate 50 1/s cone & plate [Pa · s] | 56.1 | 107.8 | 92.3 | 62.5 |
| Viscosity @ D = 2 1/s [Pa · s] | 94.9 | 173 | 122 | 108.0 |
| Tack inkometer [g · m] | 13.7 | 13.9 | 16.0 | 13.4 |

Lithographic inks Ex. 8A to 8D were evaluated on a Heidelberg MO 4-color sheet-fed press, with the following parameters:
Paper Substrate: Magnostar (115 g/m²)
Fount solution: 3% Sunfount 410 (Sun Chemical), 7% Isopropylalcohol
Fount temperature: 10° C.
Fount conductivity: 1150 S/cm
Bride roller: Active
Plates: New Camif 5 (Kodak)
Blankets: Perfect Dot (Schmautz)
Printing speed: 9000 sheets/hour
Print duration: 5000 sheets For evaluation, the printed inks were assessed by the typical press performance methods, well-known for a lithographic printing press operator skilled in the art. Standard evaluation methods can also be found in standard ink technology literature such as "The Printing Ink Manual" Springer Press ISBN: 978-0-948905-81-0. Scores for the lithographic issues that were assessed are given in Table 3, using the following scale:
Excellent (0)
Very slight
Slight
Moderate
Significant
Severe Duct flow is the ability of the ink to leave the ink duct without the help of agitators.

In addition to lithographic performance, the print quality was assessed by mechanical resistance (rub resistance), gloss, dot gain and color compliance. Scores are given for the print quality in Table 4, which are from 0-100 (0=poor, 50=acceptable, 100=excellent). The test methods (Sutherland test, gloss measurement and ISO color compliance and dot gain) are well-known by a person skilled in the art. The print evaluation scores are presented as an average of the inks in each group (i.e. average of inventive Inks 8A-8D; and average of comparative inks from Table 3).

TABLE 3

Lithographic performance evaluation of Ex. 8A to 8D

| Property | Ex. 8A Yellow | *Yellow Comp. | Ex. 8B Magenta | *Magenta Comp. | Ex. 8C Cyan | *Cyan Comp | Ex. 8D Black | *Black Comp. |
|---|---|---|---|---|---|---|---|---|
| Wet optical density | 1.30 | 1.29 | 1.45 | 1.44 | 1.49 | 1.45 | 1.89 | 1.90 |
| Ink/water balance stability | 0 | 0 | 0 | 0 | 0 | 0 | 0 | 0 |
| Scumming | 0 | 0 | 0 | 0 | 0 | 0 | 0 | 0 |
| Picking | 0 | moderate | 0 | moderate | moderate | 0 | moderate | 0 |
| Problem on restart | 0 | 0 | 0 | 0 | 0 | 0 | 0 | 0 |
| Dirtying by another color | slight | moderate | 0 | slight | 0 | 0 | 0 | 0 |
| Over-emulsification | 0 | 0 | Very slight | Very slight | Very slight | Very slight | 0 | 0 |
| Ink in the dampening train | 0 | 0 | 0 | 0 | 0 | 0 | 0 | 0 |
| Blanket tinting | Very slight | 0 | 0 | 0 | Very slight | 0 | slight | 0 |
| Framing | Very slight | 0 | 0 | 0 | Very slight | 0 | Very slight | Very slight |
| Piling | 0 | 0 | 0 | 0 | 0 | 0 | 0 | 0 |
| Duct Flow | moderate | 0 | moderate | 0 | moderate | 0 | moderate | 0 |

*Comparison process inks were selected from Sun Chemical Sunlit series.

Explanation of lithographic print issues:
Ink water balance stability is the ability of the ink to maintain a stable ink film weight during changes of the fountain settings
Scumming is the inability of fountain solution to keep the non-image area of the printing plate clean. The scum cannot be washed easily from the plate.
Picking means that the paper surface is roughened or torn, hickies (particles that stick to the blanket) are visible, usually seen when the tack is too high.
Dirtying means that a color gets contaminated by previously printed colors, often via blanket rollers, for example in a last printed color such as for example yellow.
Over-emulsification means that the ink picks up too much fountain solution.
Ink in the dampening train means that ink is transported via the dampening rollers in the direction of the fountain roller.
Tinting means that the ink has emulsified into the water fountain. Pigment is being put on the plate from the water dampeners. Tint can be easily washed off the plate.
Piling means that ink builds up on areas of the rollers, blankets, and/or plate, creating a dry accumulation known as caking or piling.
Framing means that ink is found outside the printing area around the print like an "ink frame"

TABLE 4

Evaluation of the paper print made with the colors of Examples 8A to 8D

| Property | Print evaluation Score (Inventive Inks 8A-D from Table 3) | Print evaluation score (comparative inks From Table 3) |
|---|---|---|
| Mechanical resistance after 30 and 90 minutes (Sutherland test 900 & 1800 g) | 50 | 50 |
| Mechanical resistance after 24 hours (Sutherland test 900 & 1800 g) | 93 | 85 |
| Gloss after 24 hours (60°) 8A = 58; 8B = 46; 8C = 47; 8D = 61 | 83 | 84 |
| ISO12647-1 color compliance & print quality (dot gain, trapping) | 86 | 88 |

As is shown in Table 4, the lithographic performance of the inventive inks containing recycled PET and the achievable print quality are comparable to commercial sheet-fed inks from the Crystal or Diamond ink series from Sun Chemical, containing no recycled material.

Example 9. Yellow Lithographic Sheet-Fed Inks Containing Liquid Polyester Resins Eight yellow lithographic sheet-fed inks were made containing different rPET resins of example 2, 6, 7 and 7b. In Examples 9A-9D, the PET-resins were post-blended with a dissolver. In Examples 9E-9H, the PET-resins were added to the grind-pre-mix before grinding on a three roll mill. The formulations are given in Table 5a, and basic ink properties of flow and viscosity are given in Table 5b.

Example 10. Lithographic Heat-Set Ink

A lithographic heat-set ink was made on a three roll mill. The formulation of the ink is shown in Table 6a, and the basic ink properties are shown in Table 6b.

TABLE 5a

Formulations of Examples 9A to 9H

| Raw Materials | 9A | 9B | 9C | 9D | 9E | 9F | 9G | 9H |
|---|---|---|---|---|---|---|---|---|
| *Pigment Yellow 174 | 11.54 | 11.50 | 11.54 | 11.54 | 11.54 | 11.54 | 11.54 | 11.53 |
| *Soybean oil based varnish (India sourced) | 52.25 | 52.20 | 52.25 | 52.25 | 42.24 | 42.24 | 42.24 | 42.25 |
| *Example 2 (soybean oil-modified rPET resin) | | | | | 10.05 | | | |
| *Example 7 (linseed-oil-modified rPET resin) | | | | | | 10.05 | | |
| *Example 7b (rapeseed-oil-modified rPET resin) | | | | | | | 10.05 | |
| *Example 6 (coconut-oil-modified rPET) | | | | | | | | 10.05 |
| *Inorganic extender | 5.04 | 5.00 | 5.04 | 5.04 | 5.20 | 5.20 | 5.20 | 5.20 |
| *Fatty acid methylester | 3.00 | 3.00 | 3.00 | 3.00 | 3.00 | 3.00 | 3.00 | 3.00 |
| *Phenolic stabilizer | 0.90 | 0.90 | 0.90 | 0.90 | 0.92 | 0.92 | 0.92 | 0.92 |
| *Rapeseed methylester | 2.40 | 2.40 | 2.40 | 2.40 | 2.40 | 2.40 | 2.40 | 2.40 |
| Soybean oil based varnish (India sourced) | 6.74 | 6.70 | 6.70 | 6.74 | 16.74 | 16.74 | 16.74 | 16.74 |
| Example 2 (soybean-modified) | 10.05 | | | | | | | |
| Example 7 (linseed-modified) | | 10.00 | | | | | | |
| Example 7b (rapeseed-modified) | | | 10.05 | | | | | |
| Example 6 (coconut-modified) | | | | 10.00 | | | | |
| Wax compound | 0.84 | 0.80 | 0.80 | 0.80 | 0.83 | 0.83 | 0.83 | 0.83 |
| Alkyd resin | 5.40 | 5.40 | 5.42 | 5.43 | 5.44 | 5.44 | 5.44 | 5.44 |
| Rapeseed methylester | 0.74 | 1.00 | 0.80 | 0.80 | 0.54 | 0.54 | 0.54 | 0.54 |
| Oxidative dryer | 1.10 | 1.10 | 1.10 | 1.10 | 1.10 | 1.10 | 1.10 | 1.10 |
| Total | 100.00 | 100.00 | 100.00 | 100.00 | 100.00 | 100.00 | 100.00 | 100.00 |

*Indicates a material in the color concentrate.

TABLE 5b

Properties of Examples 9A to 9H

| Property | 9A | 9B | 9C | 9D | 9E | 9F | 9G | 9H |
|---|---|---|---|---|---|---|---|---|
| Viscosity (Pa · s) @ D = 50 1/s. (T = 23° C.) | 49.9 | 47.2 | 49.0 | 48.4 | 50.0 | 48.0 | 47.8 | 48.7 |
| Viscosity (Pa · s) @ D = 2 1/s. (T = 23° C.) | 132.4 | 120.8 | 141.9 | 132.6 | 110.2 | 104.6 | 118.1 | 112.8 |
| Flow (mm) | 26 | 30 | 25 | 27 | 35 | 35 | 34 | 34 |
| Flow with 5% emulsified water (mm) | 18 | 22 | 19 | 19 | 25 | 24 | 20 | 22 |

The sheet-fed inks of Examples 9A to 9H indicate the versatility of the liquid polyester resins of the invention. Regardless of the kind of vegetable oil (soy, rapeseed, linseed, coconut), and the procedure of making the ink (inventive resin as a dilution (9A to 9D) or grinding resin (9E to 9H)), inks are obtained which behave very similarly lithographically to the inks described in Table 3.

TABLE 6a

Formulation of ink Example 10

| Raw Materials | Weight % |
|---|---|
| Inventive Polyester of example 1 | 12.00 |
| Pigment blue 15:3 | 22.25 |
| Naphtenic mineral oil (22 Centistokes , Tg −77° C.) | 4.00 |
| Mineral oil (aromatic content 14%, boiling point 260-265° C.) | 24.00 |
| Akali Refined Linseed oil | 4.00 |
| Alkyd resin (Acid value: 5, methanol number 34, viscosity: 20 Pa · s) | 2.00 |
| Phenolic Rosin resin (Acid value: 15, Softening point: 155° C. Cloud point: 144° C.) | 13.00 |
| Modified Hydrocarbon resin (Softening point: 140° C.) | 7.00 |
| Deionized water | 2.00 |
| Phenolic stabilizer BHT | 0.75 |
| Clay-base | 9.00 |
| Total | 100.00 |

TABLE 6b

Properties of ink Example 10
Properties

| Viscosity [Pa · s] @ 25° C. and D = 50 1/s | 22.00 |
|---|---|
| Tack [units] @150 rpm/30° C. | 140.00 |

The cyan heat set ink of Example 10 was printed at an optical density of 1.4 on an LWC (light weight coated) paper with a Pruefbau print proofer and dried. The transfer of ink and gloss of the inks of example 10 were comparable to a Sun Chemical heat-set ink from the SunMag series.

Example 11. Lithographic Heat-Set Inks 11A to 11C

A Sun Chemical SunMag cyan heat-set ink for printing magazines (Example 11A) was blended in a dissolver with 5.0 weight % of the resin of Example 1 (Example 11C) and as comparison also with 5 weight % of a standard soybean alkyd resin (Lawter company) (Example 11B). Table 7 shows the properties of each formulation.

TABLE 7

Properties of ink Examples 11A to 11C

|  | Example 11A | Example 11B | Example 11C |
|---|---|---|---|
| Description | Sun Chemical heat-set ink SunMag cyan | +5% Alkyd resin (comparative) | +5% Example 1 Resin (inventive) |
| Viscosity cone and plate @ D = 50 1/s [Pa · s] | 36.3 | 30.8 | 26.5 |
| Tack @300 rpm 30° C. (Tack-o-scope) [units] | 169 | 163 | 167 |
| Laray Viscosity [Pa · s] | 151 | 127 | 130 |
| Yield value @ D = 2.5 1/s [Pa · s] | 256.5 | 221.3 | 173.2 |
| Shortness Ratio (Yield value/Viscosity) | 1.7 | 1.7 | 1.3 |

As shown in Table 7, the addition of the rPET modified alkyd resin of Example 1 makes the ink "shorter" and reduces the yield value, which is the resistance of the ink to start flowing. Thus, the resin of Example 1 can be used in smaller amounts to modify or adjust viscosity and flow of heat-set inks.

Lab-prints made with a Pruefbau print proofer from the Example 11C ink (containing 5% resin from Example 1) maintain the gloss and color transfer to the substrate versus the standard ink.

Example 12. Lithographic Coating/Overprint Varnish

A lithographic coating/overprint varnish was made in a dissolver by mixing the raw materials as described above. Table 8a shows the formulation of the lithographic coating/overprint varnish, and Table 8b shows the basic coating properties.

TABLE 8a

Formulation of lithographic coating/overprint varnish Ex. 12

| Raw Materials | Weight % |
|---|---|
| Inventive Example 1 Polyester | 15.00 |
| Rapeseed methyl ester | 30.00 |
| Manganese oxidative dryer | 1.60 |
| Rheological additive Bentone | 1.00 |
| PE wax | 2.00 |
| Tung Oil | 10.00 |
| Phenolic rosin resin (Acid value: 15, Softening point: 155° C. Cloud point: 144° C.) | 25.00 |
| Refined soybean oil | 14.90 |
| Phenolic stabilizer (Butylated hydroxytoluene) | 0.50 |
| Total | 100.00 |

TABLE 8b

Coating properties of lithographic coating/overprint varnish Ex. 12

| Properties | |
|---|---|
| Viscosity [Pa · s]@ 25° C. and D = 50 1/s | 8.41 |
| Tack [units] @150 rpm/30° C. | 99.1 |
| Color [Gardner] | 7-8 |

The lithographic coating was printed on an LWC paper with a Pruefbau print proofer and dried. The gloss and adhesion was comparable to a Sun Chemical lithographic coating from the Topfinish TPF 90 series—see Table 9.

TABLE 9

Comparison of Example 12 vs. Commercial Sun Chemical Topfinish TPF 99

|  | [1]Gloss units over printed area measured after three days | [2]Adhesion Tape-test |
|---|---|---|
| Example 12 | 75 | Passed 100% |
| Topfinish TPF 99 (Sun Chemical) | 74 | Passed 100% |

[1]Measured at 60° with BYK-Gardner Micro-gloss instrument
[2]Measured using Standard Test Method for Measuring Adhesion by Tape Test (ASTM D3359)

The present results show that inks and coatings made using the liquid polyester resins of the invention, which are renewable materials (prepared from virgin, scrap, recycled, and/or reclaimed PET), perform as well as or better than inks and coatings made from non-renewable raw materials. This is significant because using recycled PET reduces waste costs, and using renewable materials reduces the cost and environmental impact of preparing ink and coating compositions.

The present invention has been described in detail, including the preferred embodiments thereof. However, it will be appreciated that those skilled in the art, upon consideration of the present disclosure, may make modifications and/or improvements on this invention that fall within the scope and spirit of the invention.

What is claimed is:

1. A method of making a liquid polyester resin comprising the steps of:
   a) depolymerizing virgin, scrap, recycled and/or reclaimed polyethylene terephthalate (PET) via an alcoholysis reaction with one or more mono-alcohols and/or polyols;
   b) transesterifying the resulting polyol oligomer of step a) with one or more vegetable oils, fatty acid alkyl esters, or oil-modified alkyd resins; and
   c) re-polymerizing the oil-modified polyol oligomer of step b) via reaction with one or more acids or anhydrides, wherein the acids or anhydrides are present in an amount of 5 wt % to 30 wt %, based on the total weight of all components;

wherein the weight ratio of the PET to the total of all mono-alcohols and polyols used in step a) is in a range from 20:1 to 10:1; to obtain a liquid polyester resin wherein the acid value of the liquid polyester resin is 5 to 50 mg KOH/g; the liquid polyester resin has one or both of a number average molecular weight of 800 to 5000 Daltons, and a weight average molecular weight of 1500 to 10,000 Daltons; the liquid polyester resin is soluble in toluene, aromatic and aliphatic mineral oils, vegetable oils, fatty acid alkyl esters, and triglycerides; and wherein the liquid polyester resin is suitable for use in lithographic inks.

2. The method of claim 1, wherein a fatty acid methylester is used in step b).

3. The method of claim 1, wherein the one or more acids or anhydrides are each independently selected from the group consisting of mono-, di-, or tricarboxylic acid derivatives.

4. The method of claim 1, wherein the components are used in an amount of:
  a) 50 wt % to 60 wt % PET, based on the total weight of all components;
  b) 5 wt % to 25 wt % one or more mono-alcohols and/or polyols, based on the total weight of all components;
  c) 25 wt % to 60 wt % one or more vegetable oils, fatty acid alkyl esters, or oil-modified alkyd resins, based on the total weight of all components; and
  d) 5 wt % to 30 wt % one or more acids or acid anhydrides, based on the total weight of all components.

5. The method of claim 1, wherein the hydroxyl value of the liquid polyester resin is less than 100 mg KOH/g.

6. The method of claim 1, wherein the acid value of the liquid polyester resin is 31 to 50 mg KOH/g.

* * * * *